United States Patent
Suess

(10) Patent No.: US 12,020,734 B2
(45) Date of Patent: *Jun. 25, 2024

(54) MULTILAYER EXCHANGE SPRING RECORDING MEDIA

(71) Applicant: Dieter Suess, Herzogenburg (AT)

(72) Inventor: Dieter Suess, Herzogenburg (AT)

(73) Assignee: Dieter Suess, Herzogenburg (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/492,735

(22) Filed: Oct. 4, 2021

(65) Prior Publication Data

US 2022/0028419 A1 Jan. 27, 2022

Related U.S. Application Data

(60) Continuation of application No. 15/925,749, filed on Mar. 19, 2018, now Pat. No. 11,138,997, which is a
(Continued)

(51) Int. Cl.
*G11B 5/66* (2006.01)
*B82Y 25/00* (2011.01)
(Continued)

(52) U.S. Cl.
CPC .............. *G11B 5/674* (2021.05); *B82Y 25/00* (2013.01); *G01R 33/093* (2013.01); *G01R 33/1207* (2013.01); *G11B 5/66* (2013.01)

(58) Field of Classification Search
CPC ...................................................... G11B 5/64
See application file for complete search history.

(56) References Cited

U.S. PATENT DOCUMENTS

| 3,543,249 A | 11/1970 | Bobeck et al. |
| 5,147,732 A | 9/1992 | Shiroishi et al. |

(Continued)

FOREIGN PATENT DOCUMENTS

| JP | 2001-118234 A | 4/2001 |
| JP | 2001-344726 A | 12/2011 |
| JP | 2001-344726 A | 12/2022 |

OTHER PUBLICATIONS

Aharoni, Amikam, "Introduction to the Theory of Ferromagnetism", Oxford University Press, Walton Street, Oxford OX2 6DP, published in the United States by Oxford University Press Inc., New York; © Amikam Aharoni, 1996, pp. 103-108.

(Continued)

*Primary Examiner* — Holly Rickman
*Assistant Examiner* — Lisa Chau

(57) ABSTRACT

A multilayer exchange spring recording media consists of a magnetically hard magnetic storage layer strongly exchange coupled to a softer nucleation host. The strong exchange coupling can be through a coupling layer or direct. The hard magnetic storage layer has a strong perpendicular anisotropy. The nucleation host consists of one or more ferromagnetic coupled layers. For a multilayer nucleation host the anisotropy increases from layer to layer. The anisotropy in the softest layer of the nucleation host can be two times smaller than that of the hard magnetic storage layer. The lateral exchange between the grains is small. The nucleation host decreases the coercive field significantly while keeping the energy barrier of the hard layer almost unchanged. The coercive field of the total structure depends on one over number of layers in the nucleation host. The invention proposes a recording media that overcomes the writeability problem of perpendicular recording media.

12 Claims, 6 Drawing Sheets

Related U.S. Application Data continuation of application No. 12/619,849, filed on Nov. 17, 2009, now Pat. No. 9,928,864, which is a division of application No. 11/424,859, filed on Jun. 17, 2006, now Pat. No. 9,978,413.

(51) Int. Cl.
  *G01R 33/09* (2006.01)
  *G01R 33/12* (2006.01)

(56) References Cited

U.S. PATENT DOCUMENTS

| | | |
|---|---|---|
| 5,583,727 A | 12/1996 | Parkin |
| 5,660,930 A | 8/1997 | Bertero et al. |
| 5,732,049 A | 3/1998 | Nishimura |
| 5,756,202 A | 5/1998 | Van Kesteren et al. |
| 5,851,643 A | 12/1998 | Honda et al. |
| 6,280,813 B1 | 8/2001 | Carey et al. |
| 6,383,668 B1 | 5/2002 | Fullerton et al. |
| 6,468,670 B1 | 10/2002 | Ikeda et al. |
| 6,535,365 B1 | 3/2003 | Lukaszew et al. |
| 6,730,421 B1 | 5/2004 | Kirino et al. |
| 6,777,112 B1 | 8/2004 | Girt et al. |
| 6,841,259 B1 | 1/2005 | Takahashi et al. |
| 6,852,426 B1 | 2/2005 | Girt et al. |
| 6,881,497 B2 | 4/2005 | Coffey et al. |
| 6,893,746 B1 | 5/2005 | Kirino et al. |
| 7,054,066 B2 | 5/2006 | Shimizu et al. |
| 7,238,385 B2 | 7/2007 | Hong et al. |
| 7,384,699 B2 | 6/2008 | Nolan et al. |
| 7,425,377 B2 | 9/2008 | Fullerton et al. |
| 7,488,545 B2 | 2/2009 | Fullerton et al. |
| 7,550,210 B2 | 6/2009 | Berger et al. |
| 7,572,526 B2 | 8/2009 | Berger et al. |
| 7,687,157 B2 | 3/2010 | Berger et al. |
| 7,833,640 B2 | 11/2010 | Marinero et al. |
| 7,846,564 B2 | 12/2010 | Li et al. |
| 7,989,096 B2 | 8/2011 | Berger et al. |
| 8,557,409 B2 | 10/2013 | Watanabe |
| 9,928,864 B2 | 3/2018 | Suess |
| 9,966,095 B2 | 5/2018 | Tonooka et al. |
| 9,978,413 B2 | 5/2018 | Suess |
| 11,133,031 B2 | 9/2021 | Suess |
| 11,138,997 B2 | 10/2021 | Suess |
| 2001/0051287 A1 | 12/2001 | Kikitsu et al. |
| 2002/0094457 A1 | 7/2002 | Krusin-Elbaum et al. |
| 2002/0146580 A1 | 10/2002 | Wang et al. |
| 2003/0099869 A1 | 5/2003 | Oikwawa |
| 2003/0108721 A1 | 6/2003 | Fullerton et al. |
| 2004/0009375 A1 | 1/2004 | Tanahashi et al. |
| 2004/0053078 A1 | 3/2004 | Kikitsu et al. |
| 2004/0057156 A1 | 3/2004 | Lee et al. |
| 2004/0191576 A1 | 9/2004 | Shimizu et al. |
| 2005/0053803 A1 | 3/2005 | Umeda et al. |
| 2005/0058855 A1 | 3/2005 | Girt |
| 2005/0181237 A1 | 8/2005 | Kitakami |
| 2005/0244679 A1 | 11/2005 | Arai et al. |
| 2006/0092696 A1 | 5/2006 | Bessho |
| 2006/0147758 A1 | 7/2006 | Jung et al. |
| 2006/0204792 A1 | 9/2006 | Osawa |
| 2006/0210834 A1 | 9/2006 | Do et al. |
| 2007/0072011 A1 | 3/2007 | Li et al. |
| 2007/0140951 A1 | 6/2007 | O'Brien et al. |
| 2007/0148499 A1 | 6/2007 | Sonobe et al. |
| 2007/0188923 A1 | 8/2007 | Shimizu et al. |
| 2007/0224453 A1 | 9/2007 | Inamura et al. |
| 2007/0243418 A1 | 10/2007 | Fullerton et al. |
| 2007/0292720 A1 | 12/2007 | Suess |
| 2008/0032490 A1 | 2/2008 | Tuominen et al. |
| 2009/0009914 A1 | 1/2009 | Schmidt et al. |
| 2011/0076516 A1 | 3/2011 | Li et al. |
| 2018/0211689 A1 | 7/2018 | Suess |
| 2018/0268852 A1 | 9/2018 | Suess |

OTHER PUBLICATIONS

Aharoni, Aharoni, editor, "Introduction to the Theory of Ferromagnetism", in International Series of Monographs on Physics, Oxford Science Publication, 1996, 3 pages.

Dobin, A. Y. et al., "Domain Wall Assisted Magnetic Recording", Cond-mat.mtrl-sci, DOI: 1063/1.2335590; arXiv:cond-mat/0605368 v1 May 15, 2006, 3 pages.

Hagedorn, F. B., "Analysis of Exchange-Coupled Magnetic Thin Films", Journal of Applied Physics, vol. 41, No. 6, May 1970, pp. 2491-2502.

Inaba, Y. et al. "Preliminary Study on (CoPtCr/NiFe)—SiO2 Hard/Soft-Stacked Perpendicular Recording Media", IEEE Transactions on Magnetics, vol. 41, No. 10, Oct. 2005, pp. 3136-3138.

Loxley, P. N. et al., "Theory of Domain Wall Nucleation in a Two Section Magnetic Wire", IEEE Transactions on Magnetics, vol. 37, No. 4, Jul. 2001, pp. 2098-2100.

Mandal et al., "Micelles-mediated synthesis of magnetic Fe3Pt nanoparticles of cubic morphology and their characterisation", Journal of Magnetism and Magnetic Materials, 320 (2008), pp. 630-633.

Richter H. J., "The transition from longitudinal to perpendicular recording", Journal of Physics D: Applied Physics, 40 (2007) R149-R177.

Sasaki, Terufumi, et al., "Magnetic Properties of Fe3Pt Invar Alloy", Journal of the Physical Society of Japan, vol. 46, No. 6, Jun. 1979, pp. 1732-1739.

Suess et al., "Exchange spring media for perpendicular recording", Applied Physics Letter 87 (2005), pp. 012504-1 to 012504-3.

Suess et al., "Exchange Spring Media for Perpendicular Recording", MMM Conference, San Jose, Nov. 2005, 17 powerpoint printout pages.

Suess et al., "Exchange spring recording media for areal densities up to 10 Tbit/in2", Journal of Magnetism and Magnetic Materials (2005), pp. 551-554.

Suess, Dieter, "Micromagnetics of Exchange Spring Media: Optimization and Limits", submitted to Journal of Magnetism and Magnetic Materials, vol. 308, Issue 2, Jan. 2007, pp. 1-49, magnet.atp.tuweien.ac.at/suess/3/papers/suess_jmmm_final.pdf.

Suess, D., "Multilayer Exchange Spring Media for Magnetic Recording", submitted to Applied Physics Letters, submitted Jun. 3, 2006, pp. 1-9.

Suess, D. et al., "Optimization of Exchange Spring Perpendicular Recording Media", Intermag Nagoya, Apr. 2005, magnet.atp.tuwien.ac.at, Vienna University of Technology, Austria 18 powerpoint printout pages.

Tannous, C. et al., "The Stoner-Wohlfarth Model of Ferromagnetism", European Journal of Physics, 29 (2008), pp. 475-487.

Thiele, Jan-Urich et al., "FeRh/FePt exchange spring films for thermally assisted magnetic recording media", Applied Physics Letters, vol. 82, No. 17, Apr. 28, 2003, pp. 2859-2861.

Victora, R.H. et al., "Composite Media for Perpendicular Magnetic Recording", IEEE Transactions on Magnetics, vol. 41, No. 2, Feb. 2005, pp. 537-542.

Wang, Jian-Ping et al., "Composite media (dynamic tilted media) for magnetic recording", Applied Physics Letters, 86, 2005, pp. 142504-1-142504-3.

Asti, G., et al., "Micromagnetic Analysis of Exchange-Coupled Hard-Soft Planar Nanocomposites." Physical Review B 69, 174401 (2004).

Asti, G., et al., "Magnetic phase diagram and demagnetization processes in perpendicular exchange-spring multilayers", Physical Review B 73, 094406 (2006).

Sato, et al., "CoPtCr—SiO2 media with Ku2 magnetic anisotropy term fabricated with Pd seed layers", Journal of Applied Physics 99, 08G907, Nov. 1, 2005, on-line Apr. 20, 2006.

Victora, R.H. and Shen, Xiao, "Exchange coupled composite media for perpendicular recording," 2005 IEEE International Magnetics Conference (Intermag), 2005, pp. 153-154.

Abraham and Aharoni, "Linear Decrease in the Magnetocrystalline Anisotropy", Phys. Rev. 20, vol. 120, No. 5, 1576-1579.

(56) References Cited

OTHER PUBLICATIONS

Choe, G, et al., "Control of Exchange Coupling Between Granular Oxide and Highly Exchange Coupled Cap Layers and the Effect on Perpendicular Magnetic Switching and Recording Characteristics", IEEE Transactions of Magnetics (Jul. 2009), 2694-2700.
Kumar Srinivasan, "L1(0) Iron-Platinum on Nanocrystalline HITPERM Soft Magnetic Underlayers for Perpendicular Recording Media", available at https://www.researchgate.net/publication/252109356 and the Carnegie Mellon University library.
Wang, J-P., et al., "Exchange Coupled Composite Mediafor Perpendicular Magnetic Recording", IEEE Transactions on Magnetics, vol. 41, No. 10, Oct. 2005, 3181-3186.
Yang, C. J., et al., "Exchange coupling in Nd2 FE14B/FE/nD2FE14B sandwich films and their magnetic properties", J. Appl. Phys. 87, 6134-1636 (2000).
Andreescu, R., "Exchange Coupled Thin Film Magnets", ProQuest Information and Learning Company, UMI No. 3140144, 2004, 24 pages.
Chen, J. S., et al., "Improvement of Recording Performance in FePt Perpendicular Media by Ag Pinning Layer," IEEE Transactions on Magnetics, vol. 41, No. 10, Oct. 2005, pp. 3196-3198.
Dobin, A. Y. et al., "Domain wall assisted magnetic recording", Journal of Applied Physics, 101, 09K108, 2007.
Gavrila, H., "New solutions for perpendicular magnetic recording media," Journal of Optoelectronics and Advanced Materials, vol. 8, No. 2, Apr. 2000, pp. 449-454.
Kneller, E. F., Hawig, R., "The Exchange-Spring Magnet: A New Material Principle for Permanent Magnets," IEEE Transactions on Magnetics, vol. 27, No. 4, Jul. 1991, pp. 3588-3600.
Kronmüeller, H. and Goll, D., "Micromagnetic theory of the pinning of domain wall boundaries," Physica B, vol. 319, 2002, pp. 122-126.

McHenry, M.E. and Laughlin, D. E., Nano-Scale Materials Development for Future Magnetic Applications, Acta Materialia, 48, 2000, pp. 223-238.
Piramanayagam, S. N., "Stacked CoCrPt:SiO2 Layers for Perpendicular Recording Media", IEEE Transations on Magnetics, vol. 41, No. 10, Oct. 2005, pp. 3190-3192.
Richter, H. J., "Media Requirements and Recording Physics for High Density Magnetic Recording", IEEE Transactions on Magnetics, vol. 29, No. 5, Sep. 1993, pp. 2185-2201.
Russak, Michael A., "LMR and PMR Media Update", THIC Meeting, Feb. 28-Mar. 1, 2006, 31 pages.
Shen, W. K., et al., Composite perpendicular magnetic recording media using [Co / Pdsi]N as a hard layer and FeSio as a soft layer, J. Appl. Phys., 97, 2005, 10n513-1.
Sonobe, Y., et al., "Thermal Stability and SNR of Coupled Granular/Continuous Media", IEEE Transactions on Magnetics, vol. 37, No. 4, Jul. 2001, 1667-1670.
Sonobe, Y., et al., "Thermal Stable CGC Perpendicular Recording Media With Pt-Rich CoPtCr and Thin Pt Layers", IEEE Transactions on Magnetics, vol. 38, No. 5, Sep. 2002, 2006-2011.
Supper et al., "Writability Enhancement Using Exchange Spring Media", IEEE Transactions on Magnetics, vol. 41, Issue 10, Oct. 2005, 3 pages.
Thiele et al., "Magnetic and Structural Properties of FePt—FeRh Exchange Spring Films for Thermally Assisted Magnetic Recording Media", IEEE Transations on Magnetics, vol. 40, Issue 4, Jul. 2004, pp. 2537-2542.
Victora, R. and Shen, X., Composite Media for Perpendicular Magnetic Recording, IEEE Transactions on Magnetics, vol. 41, No. 2, Feb. 22, 2005, pp. 537-542.
Victora, R. H., "Exchange Coupled Composite Media for Perpendicular Magnetic Recording", IEEE Transactions on Magnetics, vol. 41, No. 10, Oct. 2005, pp. 2828-2833.
Wang, J-P., et al., Composite media (dynamic tilted media) for magnetic recording, Applied Physics Letters, 86, 2005, pp. 42504-1.

MULTILAYER EXCHANGE SPRING RECORDING MEDIA

BACKGROUND

Field of Invention

This invention relates generally to magnetic recording media, and more particularly to thermally stable high density media.

Description of Related Art

Modern magnetic recording media reaches ever higher recording densities. Further increase of the areal density is believed to be limited by the superparamagnetic limit. This limit represents that as the size of the magnetic grains in the media decrease, at some grain size the thermal fluctuations at room temperature $k_B T_{300}$ become capable of overcoming the energy barrier $\Delta E = KV$, which separates the two magnetization directions of an isolated grain with a volume V and an uniaxial anisotropy constant K. This superparamagnetic limit, or thermal instability, can be overcome by increasing the anisotropy K, according to the Stoner-Wohlfarth theory. However, such an increase also results in an unfavourable increase of the coercivity $H_c$. As a consequence, these grains are thermally stable but can not be written with existing recording heads.

Various improvements have been proposed to counter this thermal instability recently, also known as the writeability problem. In U.S. Pat. No. 6,468,670 a continuous ferromagnetic overlayer was introduced to increase the Signal to Noise Ratio (SNR). U.S. Pat. Nos. 6,280,813 and 6,383,668 addressed the thermal instability problem by replacing the conventional single magnetic recording layer with two ferromagnetic films that are antiferromagnetically coupled together across a nonferromagnetic spacer film, and a ferromagnetic layer that is coupled to a synthetic antiferromagnet, respectively. This idea reduces the demagnetizing field of the bits in the case of longitudinal magnetic recording. U.S. Pat. No. 5,583,727 proposed to overcome the problem by employing thermally assisted recording. In the paper "FeRh/FePt exchange spring films for thermally assisted magnetic recording media" Applied Physics Letters, Vol. 82, Issue 17, April 2003, pp. 2859-2861, Thiele et al. suggested to lower the coercive field by the use of FePt/FeRh bilayer system. The proposed architecture included a hard layer, exchange coupled to an antiferromagnetic layer. After heating the antiferromagnetic layer across a transition temperature, it became ferromagnetic with a large magnetic moment and low magnetocrystalline anisotropy. Thus, upon crossing the transition temperature the antiferromagnetic layer acted as a magnetic soft layer that helped to reverse the hard layer.

In the paper "Composite Media for Perpendicular Magnetic Recording", IEEE Transcations on Magnetics, Vol. 41, No. 2, February 2005, pp. 537-542, R. H. Victora and X. Shen proposed magnetic multilayer structures composed of magnetically hard and magnetically soft layers. In the model of Victora and Shen, the magnetization of the soft and the hard part of each grain remained uniform. In order to decrease the coercive field, the exchange coupling between these layers had to be reduced with a decoupling layer. Motivated by the theoretical work, Wang et al. performed an experimental work on two layer composite media. The results were reported in "Composite media (dynamic tilted) media for magnetic recording", Applied Physics Letters, Vol. 86, April 2005, pp. 142504. Wang et al. concluded that a coupling layer was required in composite media to decrease the exchange coupling between the soft and hard layer, in accordance with the theory. This was in contrast to the paper "Exchange spring media for perpendicular recording," Applied Physics Letters, Vol. 87, July 2005, pp. 12504-12507 by Suess et al., incorporated herein by reference in its entirety, where states with inhomogeneous magnetization were formed.

The paper "Preliminary Study on (CoPtCr/NiFe)—SiO2 Hard/Soft-Stacked Perpendicular Recording Media", IEEE Transactions on Magnetics, Vol. 41, No. 10, October 2005, pp. 3136, Y. Inaba et al. considered a sufficiently thin soft magnet coupled to a sufficiently thin hard magnet in order to keep the magnetization uniform and parallel in both layers during reversal. The paper "Exchange spring recording media for areal densities up to 10 $Tbit/in^2$", Journal of Magnetism and Magnetic Materials, Vol. 290-291, 2005, pp. 551-554 (available online 18 Dec. 2004) by Suess et al., incorporated herein by reference in its entirety, proposed a tri-layer structure which was composed of a hard layer at bottom, a soft layer in the middle and a hard layer on top.

The paper "Exchange spring media for perpendicular recording," Applied Physics Letters, vol. 87, 30. June 2005, pp. 012504, by Suess et al., incorporated herein by reference in its entirety, domain wall assisted recording on bilayers was presented. Subsequent work by A. Dobin and H. J. Richter (presented at the Intermag conference 2006, talk DB-10, San Diego, CA, May 2006; preprint available at http://arxiv.org "Domain Wall Assisted Magnetic Recording" by Dobin and Richter) followed the same approach.

In previous works it was not shown that a finite value of the anisotropy in the soft magnetic layer does not reduce the thermal stability of the structure. This question needs to be investigated, as larger anisotropies in the softer layer reduce the energy that is required to push a domain wall from the soft layer to the hard layer. Further, typical multilayer exchange spring media do not even contain a soft magnetic layer. Instead, it contains a nucleation layer which can be magnetically hard. The softest layer in the nucleation layer can have a coercive field similar to typical fields of recording heads.

For all these reasons, the choice of layer architectures and their anisotropies to overcome the superparamagnetic limit in optimal fashion remain a topic of intense investigations.

SUMMARY

Briefly and generally, embodiments according to the invention include a magnetic recording media wherein the magnetic recording layer consists of a multilayer structure, with a special multilayer host layer (nucleation host) and a hard magnetic storage layer ($H_c$>2 T). The anisotropy of the softest layer in the nucleation host is significantly smaller than in the hard layer. In some embodiments the ratio of anisotropies can reach a factor of 2. During writing a domain wall is formed in the nucleation host that propagates through the whole grain structure and finally reverses the hard magnetic storage layer. The nucleation host significantly decreases the coercive field of each grain of the proposed media but has only little influence on the thermal stability. In some embodiments the host layer comprises of just one layer, the media is a bilayer structure with one hard magnetic nucleation host and an even harder storage layer. In embodiments, where the host layer comprises more than one layer the anisotropy increases from one layer to the next layer. The layers can be strongly exchange coupled. The exchange coupling can be direct or via a thin coupling layer in order to achieve strong coupling. If the layers are strongly coupled a domain wall is formed across the hard/soft interface during reversal.

In embodiments with a nucleation host having the same magnetization as the hard magnetic storage layer and consisting only of one layer, the coercive field can be reduced by a factor of up to five compared to the coercive field of the hard magnetic storage layer without the nucleation host at the same thermal stability.

In embodiments, where the nucleation host has an exchange constant and magnetic polarization in the nucleation host larger than in the hard magnetic storage layer, the reduction of the coercive field can be even larger than a factor of five.

The coercive field can also be increased by increasing the number of layers in the nucleation host. In embodiments with two or three layers in the nucleation host, the coercive field is reduced by a factor of up to 9 and 13, compared to the coercive field of the hard magnetic storage layer without the nucleation host.

In other embodiments further increase of the coercive field is reached by increasing the anisotropy continuously. For a 25 nm thick layer with quadratically increasing anisotropy and a maximum value of $K_1=2$ $MJ/m^3$ in the nucleation host the coercive field is smaller by a factor of 10 compared to a layer consisting of a material with $K_1=2$ $MJ/m^3$, while, remarkably, the thermal stability of these two architectures is substantially the same.

Embodiments also show a characteristic dependence of the coercive field on the angle between the external field and the easy axis of the hard layer. In contrast to single phase recording media that shows a Stoner-Wohlfarth like switching field dependence as a function of the external field angle, exchange spring media behave more like "pinning magnets". In pinning permanent magnets a high coercive field can be achieved by the introduction of pinning centres, such as soft magnetic inclusions or non magnetic inclusions that trap a domain wall and hence hinder the domain wall from propagating through the whole magnet. Therefore, the reversal of the magnetization due to domain wall motion is stopped by the pinning centres. Typically, in pinning magnets the dependence of the coercive field as a function of the angle α between the external field and the easy axis can be described by, $H_c=1/\cos(\alpha)$. That implies that for small angles between the external field and the easy axis the switching field is less sensitive to the easy axis distribution. This makes exchange spring media also a potential candidate for patterned media since the switching field distribution due to an easy axis distribution is reduced.

Generally, the above embodiments provide marked improvement against the superparamagnetic limit as the coercive field is reduced by the spatially varying anisotropy in the nucleation host, while the thermal stability is determined only by the domain wall energy in the hardest magnetic storage layer, which is not influenced by the variations of the anisotropy of the nucleation host.

This is achieved because the new architecture removes the proportionality of the energy barrier to the coercive field. In some cases the coercive field can be inversely proportional to the layer thickness while the energy barrier remains independent of it. Therefore, with these new architectures embodiments overcome the writeability problem of extremely hard magnetic storage layers with high thermal stability.

DETAILED DESCRIPTION

Figure 1:
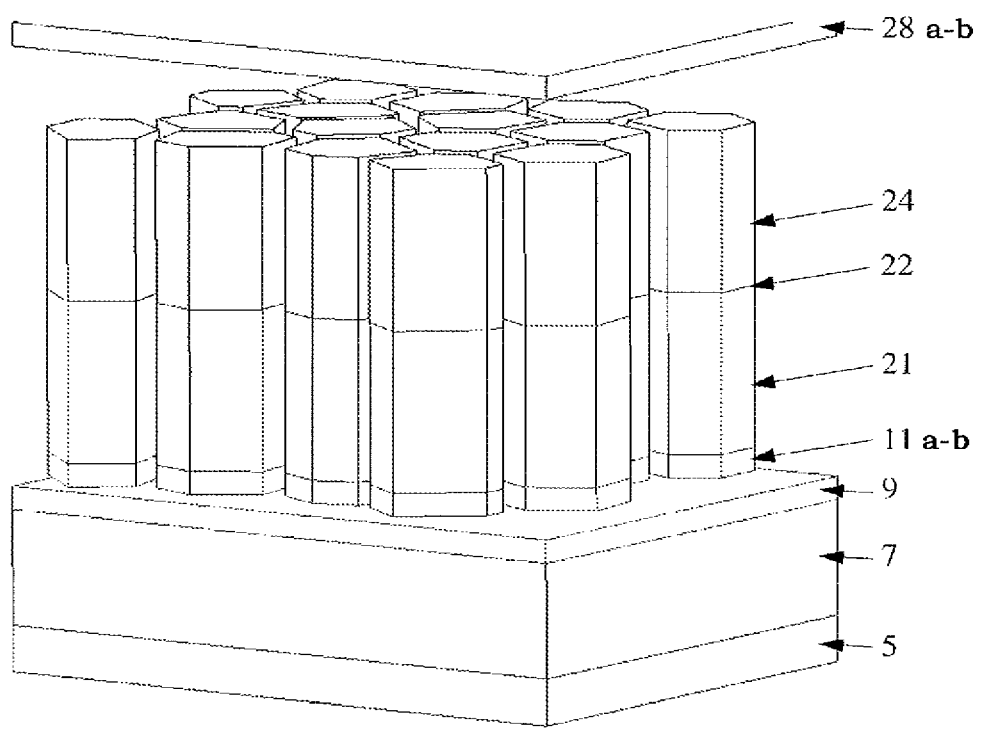
FIG. 1 is a schematic sectional view of a magnetic recording disk with a multilayer exchange spring recording media.

FIG. 1 illustrates the cross sectional view of the layer structure of an existing disk of recording medium. The disk includes a substrate 5, a soft magnetic underlayer 7, an interlayer 9, an optional seed layer 11a and underlayer 11b, a hard magnetic storage layer 24, strongly exchange coupled to a nucleation layer 21, an optional coupling layer 22, a protective layer 28a, and a lubricant layer 28b. Although the hard magnetic storage layer is shown on top of the nucleation layer, the order of the layers can also be reversed.

Substrate 5 may be made of any suitable material such as ceramic glass, amorphous glass, or NiP plated AlMg or an AlMg alloy base with a NiP surface coating.

Soft magnetic underlayer 7 is deposited on substrate 5. soft magnetic underlayer 7 may be made of any suitable material such as NiFe, CoNbB, FeAlSi, CoFeB, FeTaN, FeTaC, FeCoB, FeSiO, FeAlSi, FeTaN, FeN, CoFe, CoZr, CoFeB, CoZrNb, NiFeNb or equivalents. Soft magnetic underlayer 7 may have a thickness in the range of about 50 nm to about 500 mm.

Interlayer 9 may be important for the grain structure of the hard magnetic recording media. Interlayer 9 may be any suitable material such as Pt, Ge, Si, CoCr, $SiO_2$, Au, Al, CoZr, Ta, Ti, TiCr, Ru, RuCrCo, TiZr, or equivalents.

Optional seed layer 11a may be used in order to improve the growth of underlayer 11b. Optional seed layer 11a may be formed of a suitable material of hcp, fcc, bcc or even amorphous structure. It provides a smooth wetted surface for the subsequent growth of underlayer 11b.

Underlayer 11b is deposited onto optional seed layer 11a, if present, or otherwise directly onto substrate 5. Underlayer 11b may be formed of a suitable hcp material with a lattice parameter close to the alloys of the first layer in the magnetic layer. These alloys may be, for example, Ru-based alloys, Re-based alloys or Pd based alloys. Underlayer 11b may have a thickness in the range of about 1 nm to about 20 nm. Other thicknesses can also be used.

The recording media includes hard magnetic storage layer 24 and softer nucleation host 21. Hard magnetic storage layer 24 can be a ferromagnet, ferrimagnet, antiferromagnet, or any other synthetic antiferromagnetic structure. The coupling between the nucleation host and the hard magnetic storage layer may be ferromagnetic or antiferromagnetic. Hard magnetic storage layer 24 may be formed from any material that has large perpendicular anisotropy. These materials include tetragonal: $L1_0$-ordered phase materials, CoPt and FePt based alloys, CoPtCr alloys, including CoPt-CrB, CoPtCrTa, and CoCr based granular media. Other high anisotropy materials suitable for the recording layer 16 include pseudo-binary alloys based on the FePt and CoPt $L1_0$ phase, i.e., FePt—X and CoPt—X, where the element X may be Ni, Au, Cu, Pd or Ag, as well as granular composite materials such as FePt—C, FePt—ZrO, FePt—MgO, FePt—$B_2O_3$, materials containing at least one of B, Cu, Ag, W, Mo, Ru, Si, Ge, Nb, Pd, Sm, Nd, Dy, Hf, Mn, Ni and other similar composites.

In some embodiments the thickness of hard magnetic storage layer 24 is between 3 nm and 30 nm. In other architectures it can be outside these ranges. In embodiments where the anisotropy of nucleation host 21 is continuously increased, hard magnetic storage layer 24 is optional.

In some embodiments nucleation host 21 can be formed on hard magnetic storage layer 24. In other embodiments the order is changed so that hard magnetic storage layer 24 is deposited on nucleation host 24. Nucleation host can be formed as a granular or a continuous film. The exchange coupling between hard magnetic storage layer 24 and nucleation host 21 can be sufficiently strong to enable the formation of a domain wall across the interface of these layers during reversal.

Any of the materials, listed for hard magnetic storage layer 24 can be also used for forming nucleation host 21. In some embodiments a magnetic material is referred to as "hard" if its coercive field Hc>0.5 T, and "soft" is its coercive field is Hc<0.5 T. In some embodiments these terms are defined in a relative sense: the coercive field of (soft) nucleation host 21 can be half of the coercive field of hard magnetic storage layer 24. In other embodiments this ratio can be different. In some embodiments a layer is referred to as "hard", if $\Delta k_{max}/k_{min}$<0.5. The definition of the terms in this inequality will be given below.

In some embodiments the grains of nucleation host 21 are aligned with the grains of hard magnetic storage layer 24, as shown in FIG. 1. In some embodiments this alignment is only approximate. These embodiments are sometimes called columnar media.

In some embodiments nucleation host 21 and hard magnetic storage layer 24 are in direct contact. In other embodiments, they are separated by optional coupling layer 22. Optional coupling layer 22, disposed between hard magnetic storage layer 24 and nucleation host 21, can provide a strong "exchange coupling". Optional coupling layer 22 may enhance the granular growth between hard magnetic storage layer 24 and nucleation host 21. Optional coupling layer 22 may have a thickness between 0.1 nm and 3 nm. Optional coupling layer 22 may provide an exchange constant A in excess of $A=10^{-14}$ J/m. In conventional perpendicular recording the exchange constant between grains is small. In exchange spring media both large and small values of the lateral exchange can be useful. For a large value of the lateral exchange in hard magnetic storage layer 24 the transitions of the bits are not necessarily located at the grain boundaries. Instead, domain walls are formed that separate the bits. A large value of the anisotropy of hard magnetic storage layer 24 decreases the domain wall width, so that the transition parameter of the bits may not be significantly larger than 2 nm to 3 nm that can be equal to about the grain diameter. In the case of large lateral exchange the domain walls are not pinned at the grain boundary in the hard magnetic storage layer but the domain walls are pinned due to the granular laterally weakly exchange coupled nucleation host. A weak exchange in the hard magnetic storage layer may require a large exchange in the nucleation layer.

In the following the plane of nucleation host 21 will be identified as the x-y plane. For example, in a magnetic storage disk, the plane of the disk is essentially parallel to the x-y plane of nucleation host 21. The z coordinate then parametrizes the direction of the thickness of nucleation host 21.

In some embodiments nucleation host 21 contains more than one layer which have different anisotropy K. In other embodiments nucleation host 21 is characterized by a spatially varying anisotropy K(z). In these embodiments, the anisotropy assumes more than one value in a substantial magnetic portion of nucleation host 21. In this sense the embodiments differ from single layer nucleation hosts, whose anisotropy assumes varying values only in an insubstantial portion. This may occur e.g. because of surface effects, in a very thin layer at the surface. Also, the variation is occurring in the magnetic nucleation host 21 itself. In this sense, embodiments differ from disks which have a single layer nucleation host 21 and a spacer layer.

In some embodiments, the softest, or smallest value of the anisotropy K is half of the anisotropy of hard magnetic storage layer 24. In other embodiments this ratio can be closer to one. This softest value of K is the anisotropy of the softest layer in multilayer embodiments, or the softest value in the spatially varying embodiments.

In some embodiments the lateral, or nearest neighbor, exchange between the grains of nucleation host 21 is small.

Protective layer 28a, sometimes called overcoat, is typically diamond-like amorphous carbon or nitrogenated carbon, but may be any conventional disk overcoat. Overcoat 28a is typically less than 15 nm thick.

All of the layers described above from seed layer 11 to overcoat 28a can be sputtered in a continuous process in either an in-line sputtering system or a single disk system, such as commercially available single disk systems with multiple sputtering target capacity. The sputter deposition of each of the layers can be accomplished using standard targets and techniques known to those in the field with the modifications described above.

In the following, some considerations will be provided, which may be relevant for understanding features of the embodiments. Some embodiments combine benefits of softer magnetic layer with that of harder magnetic layers.

In some embodiments nucleation host 21 includes only one layer. In these embodiments the recording media is referred to as a bilayer, which includes nucleation host 21 and hard magnetic storage layer 24. Under the assumption that both layers remain completely homogeneous, the bilayer structure does not provide any improvements for the writeability compared to a single layer system. This conclusion is different from that of Y. Inaba et al. in the paper "Preliminary Study on (CoPtCr/NiFe)—SiO2 Hard/Soft-Stacked Perpendicular Recording Media", IEEE Transactions on Magnetics, Vol. 41, No. 10, October 2005, pp. 3136.

A hard/soft layer structure where the magnetization in the hard and soft layer is parallel and uniform can be described with one average magnetization $M_{eff}=(M_{hard} \times l_{hard}+M_{soft} \times l_{soft})/(l_{soft}+l_{hard})$ and one average anisotropy constant $K_{eff}=(K_{hard} \times l_{hard}+K_{soft} \times l_{soft})/(l_{soft}+l_{hard})$. In a simple model the energy barrier can be estimated by $\Delta E=F \times K_{eff} \times (l_{soft}+l_{hard})$, where F is the area of the basal plane of one grain of the media. The coercive field is $H_c=2K_{eff}/M_{eff}$. The ratio of the energy barrier to the coercive field, the "ratio barrier" $\Delta E/H_c$ only depends on the value of the average magnetization and the grain volume. Therefore, this bilayer structure leads to the same thermal stability as the single layer structure of the same thickness for the same value of the coercive field and for the same value of the average magnetization.

In embodiments of the invention, the design of the recording media is capable of supporting the formation of a domain wall during reversal. This magnetic domain wall becomes pinned at hard/soft interfaces. Compared to single phase media with the magnetic properties of the hard layer, the coercive field in a bilayer structure can be significantly reduced. In embodiment this reduction reaches a factor of four, as described by Loxley et al. in the paper: "Theory of Domain Wall Nucleation in a Two Section Magnetic Wire", IEEE Transactions on Magnetics, Vol. 37, July 2001, pp. 1998-2100). However, Loxley et al considered an idealized magnetic wire instead of a magnetic recording medium. A factor of five decrease was shown by Hagedorn in the paper: "Analysis of Exchange-Coupled Magnetic Thin Films," Journal of Applied Physics, Vol. 41, 1970, pp. 2491-2502, when a finite anistropy in the soft layer was assumed.

A feature of embodiments of the invention is that the coercive field and the thermal energy barrier can be separately adjusted. In contrast, the above works considered these quantities closely connected and thus not adjustable separately. The thermal energy barrier is primarily determined by the material parameters of hard magnetic storage layer 24, substantially independently from the material parameters of nucleation host 21. Thus, in embodiments the ratio $$r = \frac{\Delta E_{thermal}}{\Delta E_{hyst}}$$

can be selected in the range of 0.5 to 10. In others the range can be even broader. Here the thermal energy barrier $\Delta E_{thermal}$ is the energy barrier separating the two magnetic states, which has to be overcome by the thermal fluctuations. The hysteretic energy loss $\Delta E_{hyst} = J_s H_c V$ is the product of grain volume V, the coercive field $H_c$ and the average magnetization $J_s$ which characterizes the energy to be overcome during a write process. For single domain particles these energy scales are closely connected with a fixed ratio r of 0.5.

The field, required to overcome the pinning field to push a domain wall from the softer layer to the hard layer depends on the difference between the anistropy constants of these layers as described by a formula by Hagedorn et al. If the number of layers is increased, this difference can be decreased leading to a reduction of the pinning and coercive field. For example, if the anisotropy of the m-th layer assumes the value $K^m = (m-1)K_{hard}/(N-1)$, the difference between the anisotropy constants of adjacent layers is $K_{hard}/(N-1)$. Such an architecture leads to a coercive field of the whole structure of $H_c = 1/(4N-4) \times 2 K_{hard}/J_s$. Here, $K_{hard}$ is the anisotropy constant of the hardest layer (the hard magnetic storage layer), $J_s$ the magnetic polarization of the structure and N is the number of layers. For sufficiently thick hard magnetic storage layer the thermal stability is given by the domain wall energy in the hard magnetic storage layer. Importantly, therefore, at zero field the nucleation host does not lower the thermal stability.

Figure 2:
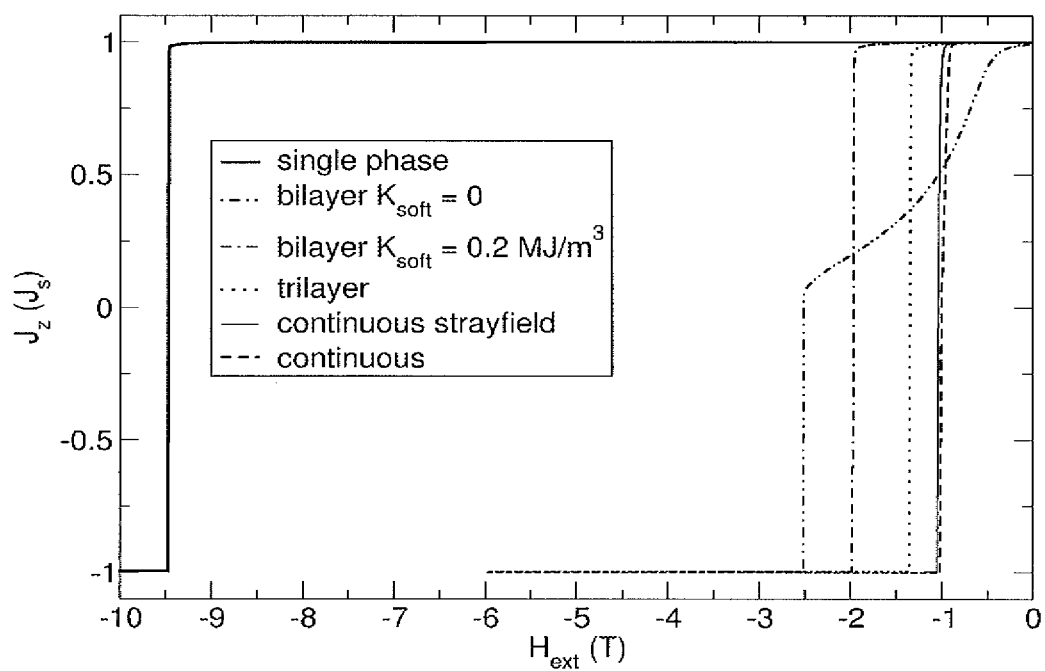
FIG. 2 shows a hysteresis loop in some embodiments. For comparison, the hysteresis loop of a conventional single phase grain is shown.

FIG. 2 illustrates the micromagnetic simulations, which were performed to demonstrate the benefit of multilayer exchange spring media. FIG. 2 compares the hysteresis loop of different multilayer exchange spring media with a conventional recording media. Only one grain of the media was modeled. The parameters are for illustrative purposes only and can widely vary in different embodiments. The external field is applied at an angle of 0.5°. Nucleation host 21 is assumed to have a granular structure. The thickness of the entire grain structure is 25 nm. The grain diameter is 5 nm. The magnetization is $M_s = 0.5$ T/$\mu_0$. The grains are formed from a magnetic hard material with $K_1 = 2$ MJ/m$^3$.

The trace "single phase" illustrates an embodiment in which the grains have a single anisotropy value. The trace "bilayer soft $K_{soft} = 0$" illustrates an embodiment, where 7 nm of the grain are magnetically extremely hard with $K_{hard} = 2$ MJ/m$^3$, the other 18 nm are perfectly soft $K_{soft} = 0$. The trace "bilayer soft $K_{soft} = 0.2$ MJ/m$^3$" illustrates an embodiment where again 7 nm of the grain is extremely hard $K_{hard} = 2$ MJ/m$^3$. The softer region has still a relative high anisotropy of $K_{soft} = 0.2$ MJ/m$^3$. The "trilayer" trace illustrates the embodiment where 7 nm again has $K^1 = K_{hard} = 2$ MJ/m$^3$, 5.6 nm of the grain has $K^2 = 1.11$ MJ/m$^3$ and 12.4 nm of the grain has $K^3 = 0.22$ MJ/m$^3$.

Visibly, the coercive field of the bilayer structures is severely reduced from that of the single phase media by a factor of about 4-4.5. The trilayer structure has its coercive field further reduced, by about a factor of 7 compared to the single phase media. The discrepancy to the theoretical limit of 9 can be attributed to the finite layer thickness. The effect of reversible magnetization processes can be observed by the non-rectangular shape of the hysteresis loop.

Some embodiments have a gradually varying anisotropy K(z) in nucleation host 21. Such embodiments will be referred to as "G-layer". In FIG. 2 the hysteresis loop of G-layers are shown. The trace "continuous strayfield" illustrates the embodiment in which the anistropy increases quadratically as a function of the z coordinate, the distance from the bottom of the grain: K(z)~z$^2$. The demagnetizing field of the grain is taken into account. The trace "continuous" illustrates the embodiment in which the demagnetizing field was omitted. FIG. 2 shows that the coercive field is just $\frac{1}{10}$ of the coercive field of the single layer structure for a thickness of 25 nm. It is also interesting to note that the hysteresis loop is almost perfectly rectangular. If the strayfield is taken into account, the coercive field increases by about 3%, which can be attributed to the additional uniaxial anisotropy caused by the shape anisotropy.

The variation of K(z) can take many different form. The rise can be linear, or follow any polynomial or other rising function. It can have plateaus or steps, connected by rising segments. It can also have decreasing segments. In some embodiments, the functional form of K(z) is chosen to optimize the switching properties of the recording media, e.g. by increasing the thermal energy barrier while keeping the writing field, or coercive field, essentially unchanged, or even decreasing it.

Figure 3:
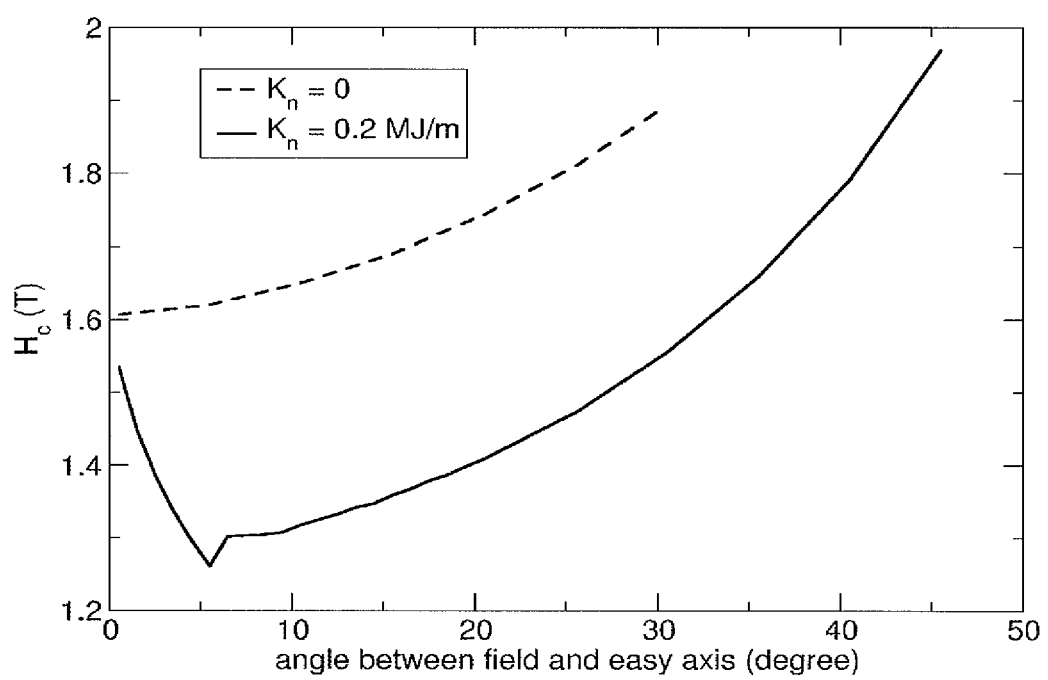
FIG. 3 shows the coercive field as a function of the angle between the easy axis and external field for bilayers with different values of the anistropy in the softest layer in the nucleation host.

FIG. 3 illustrates the angular dependence of the coercive field $H_c(\alpha)$ as a function of the angle $\alpha$ that is measured between the easy axis and the external field. So the coercive field is measured for different angles $\alpha$. The solid line shows the angular dependence of the trilayer of FIG. 2. The dotted line shows the angular dependence of the coercive field if the anisotropy in the softest layer of the nucleation host is set to zero. In contrast to single phase media, the coercive field does not have a minimum for a field angle of 45°. The pinning force to depin the domain wall at the hard/soft interfaces depends inversely from the cosine of the angle between the easy axis and the external field. It can be seen that the coercive field $H_c(\alpha = 20°)$ is smaller than $H_c(\alpha = 45°)$. A similar dependence can be found if instead of the coercive field the field $H_m(\alpha)$ is introduced, where $H_m$ is the field that is required to decrease the magnetization of the saturated film ($M_z/M_s = 1$) to $M_z/M_s = -0.5$. Differences of the field $H_m$ and $H_c$ occur if the media comprises of a thick soft layer with high magnetization.

Figure 4:
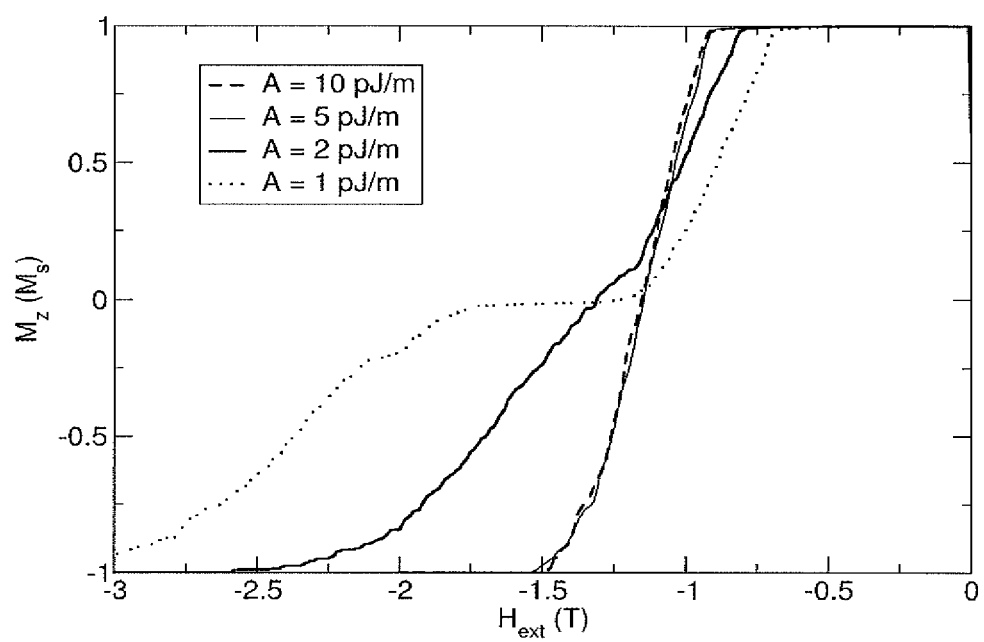
FIG. 4 shows the hysteresis loop of different exchange spring films comprising of 14×14 grains.

FIG. 4 shows the hysteresis loop of an exchange spring perpendicular recording film consisting of 14×14 grains. The parameters of this embodiment are for illustrative purposes only. The average grain diameter is 5 nm. The film thickness is 23 nm. The exchange field between the grains is about 0.25T. The thickness of the nucleation layer is equal to the thickness of the hard magnetic storage layer which is 10.5 nm. The two layers are separated by a 2 nm thick optional coupling layer 22. The exchange constant in the coupling layer is varied from $A=1\times10^{-12}$ J/m to the bulk value of the exchange in the nucleation layer and the storage layer which is $A=1\times10^{-11}$ J/m. The hysteresis loops show that with increasing coupling the coercive field decreases. Furthermore the hysteresis curves for $A=1\times10^{-12}$ J/m and $A=2\times10^{-12}$ J/m show that the slope of the hysteresis loop $$k = \frac{dM}{dH}\frac{H_c}{M_s}$$

changes in the interval $-0.7 < M/M_s < 0.7$, significantly. For $A=2\times10^{-12}$ J/m the slope k changes in the interval $-0.7 < M/M_s < 0.7$ by about a factor of 2.5. In embodiments the anisotropy of hard magnetic storage layer 24 and the exchange coupling between nucleation host 21 and hard magnetic storage layer 24 is chosen to keep the change of the slope k smaller than 3. A ratio $k_{max}/k_{min} < 3$ indicates a strong coupling between nucleation host 21 and hard magnetic storage layer 24.

Furthermore the squareness S of the hysteresis loops was calculated.

$$S = 1 - \frac{dM}{dH}\frac{H_c}{M_s}\bigg|_{H_c}.$$

For the fully coupled case ($A=1\times10^{-11}$ J/m) the squareness is 0.8. It is important to note that for all calculations the hysteresis loops are not desheared.

Figure 5:
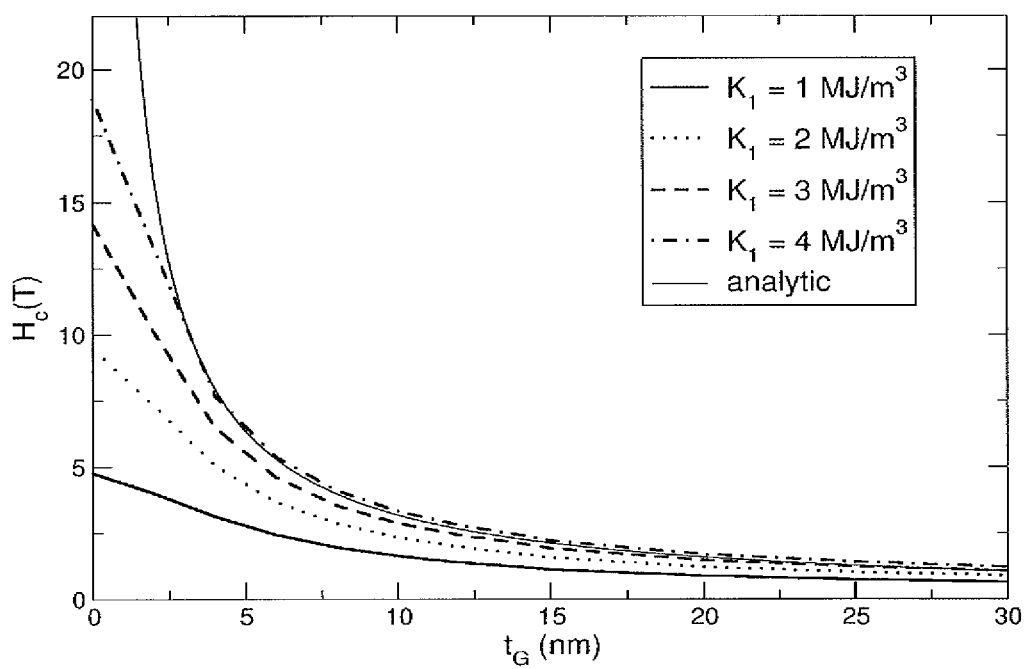
FIG. 5 illustrates the reduction of the coercive field for a nucleation host with a continuously increasing anisotropy.

FIG. 5 illustrates the reduction of the coercive field for nucleation host 21 with thickness $t_G$ and a continuously increasing anisotropy, fully exchange coupled to the hard magnetic storage layer. The value of the anisotropy constant of the hard magnetic storage layer is changed from 1 MJ/m³ to 4 MJ/m³. FIG. 4 shows the reduction of the coercive field of hard magnetic storage layer 24 with a thickness of 20 nm and a value of the anisotropy constant of $K_{hard}$ that is coupled to a G-layer. The anisotropy constant depends quadratically on the depth z in the layer, $K(z)=z^2 K_{hard}/t_G^2$. The grain has the maximum anisotropy ($K_{hard}$) at the surface of nucleation host 21. The thickness of nucleation host 21 is $t_G$. This embodiment does not have hard magnetic storage layer 24.

Figure 6:
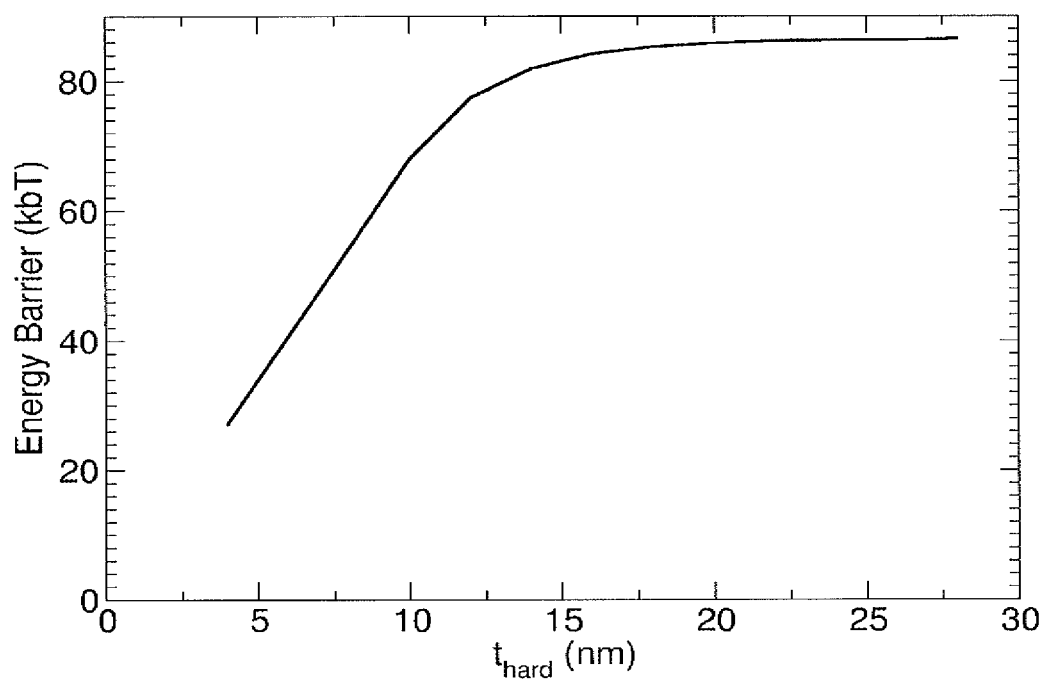
FIG. 6 shows the energy barrier as a function of the hard layer thickness.

FIG. 6 illustrates the influence of the thickness of hard magnetic storage layer 24 on the energy barrier of the bilayer structure. The particular parameters are for illustrative purposes only—other embodiments have different parameters. The thickness of nucleation host is 20 nm (limit of infinite thick soft layer). The anisotropy in hard magnetic storage layer 24 is $K_{hard}=1\times10^6$ J/m³. The grain diameter is 6 nm. The energy barrier levels out for thicknesses larger than 20 nm. It is important to stress that at zero field the energy barrier does not depend on nucleation host 21. Due to thermal fluctuations a domain wall is formed in the nucleation host. The energy of the domain wall successively increases as it is driven by thermal fluctuations in the harder layers. The domain wall has largest energy when it is located in the hardest layer. The difference this highest energy state minus the energy of the homogenous state when the spins in the grain point up (down) denotes the energy barrier. For all structures the highest energy state is given by the domain wall energy in the hard magnetic storage layer which is independent if a nucleation host 21 is present. The demagnetizing field of the structure may slightly decrease the energy barrier. The decrease of the energy barrier may be larger if a nucleation host is present as without nucleation host 21. In embodiments the energy barrier of a typical grain of hard magnetic storage layer 24 is smaller by 25% of the energy barrier of a typical grain of hard magnetic storage layer 24 without the nucleation host at most.

We note that parameters of an unknown magnetic recording media can be characterized by different methods. For example, an energy barrier of a hard magnetic storage layer can be determined: (i) by depositing only the hard magnetic storage layer on a non-magnetic substrate, or (ii) by removing a nucleation host from a multilayer structure; or (iii) by performing a micromagnetic calculation with parameters appropriate for the multilayer.

In some embodiments, as described throughout this specification, a magnetic recording medium is comprising: an essentially non-magnetic substrate; and an exchange coupled magnetic multilayer structure, comprising: a nucleation host with an anisotropy varying in the film normal direction; and a hard magnetic storage layer; wherein the anisotropy assumes more than one value in substantial magnetic portions of the nucleation host.

In some embodiments of the magnetic recording medium, an exchange coupling between the nucleation host and the hard magnetic storage layer is sufficiently strong and the nucleation host is sufficiently hard so that the derivative k of the normalized magnetization with respect to the external field normalized to the coercive field does not change by more than a factor of 3 in a magnetization interval $-0.7 < M_z/M_s < 0.7$, wherein:

$$k = \frac{dM}{dH}\frac{H_c}{M_s}$$

M being a magnetization of the recording medium, $M_z$ being a component of the magnetization perpendicular to a plane of the recording medium, H being an external magnetic field parallel to a normal of the layers, dM/dH being the derivative of the magnetization with respect to the external magnetic field, $H_c$ being a coercive field, $M_s$ being a saturation magnetization.

In some embodiments of the magnetic recording medium, the nucleation host and the hard magnetic storage layer are in direct contact.

In some embodiments of the magnetic recording medium, the nucleation host, comprises of ferromagnetic layers with increasing anisotropy from layer to layer.

In some embodiments of the magnetic recording medium, the nucleation host, comprises a ferromagnetic layer with a continuous change of anisotropy in the film normal direction.

In some embodiments of the magnetic recording medium, the nucleation host and the hard magnetic storage layers comprise ferromagnetic layers with increasing anisotropy values.

In some embodiments of the magnetic recording medium, the hard magnetic storage layer comprises at least one of Cr, Pt, Ta, B, Fe, Cu, Ag, W, Mo, Ru, Si, Ge, Nb, Co, Pd, Sm, Nd, Dy, Hf, Mn and Ni.

In some embodiments of the magnetic recording medium, a coercive field of the nucleation host is less than ½ of a coercive field of the hard magnetic storage layer.

In some embodiments of the magnetic recording medium, a $H_c(\alpha=20°)<H_c(\alpha=45°)$, wherein $H_c(\alpha)$ is the coercive field if the angle between the external field and the film normal is $\alpha$.

In some embodiments of the magnetic recording medium, a)) $H_m(\alpha=20°)<H_c(\alpha=45°)$, wherein $H_m(\alpha)$ is the required field to reduce the normalized magnetization from the saturation to −0.5 if the angle between the external field and the film normal is $\alpha$.

In some embodiments of the magnetic recording medium, the nucleation host comprises at least one of Fe, Ni, Al, Si, B, Co, Cr, Pt, Ta, Cu, Ag, W, Mo, Ru, Si, Ge, Nb, Co, Pd, Sm, Nd, Dy, Hf, Mn, Ni and O.

In some embodiments of the magnetic recording medium, the nucleation host has a thickness smaller than 30 nm.

In some embodiments of the magnetic recording medium, the nucleation host comprises grains with an average diameter greater than 2 nm and less than 10 nm.

In some embodiments of the magnetic recording medium, a height of a plurality of grains is greater than a diameter of the grains.

In some embodiments of the magnetic recording medium, the nucleation host is in direct contact with the hard magnetic storage layer.

In some embodiments of the magnetic recording medium, the nucleation host is separated from the hard magnetic storage layer by a layer of thickness less than 5 nm.

In some embodiments of the magnetic recording medium, the nucleation host is coupled to the hard magnetic storage layer by a strong exchange coupling layer.

In some embodiments of the magnetic recording medium, the nucleation host is coupled to the hard magnetic layer by antiferromagnetic coupling.

In some embodiments of the magnetic recording medium, parameters of the medium comprise: a anisotropy constant in the nucleation host $K''1$ as a function of the layer depth a hard magnetic storage layer anisotropy constant $K^h1$; a nucleation host grain diameter; a hard magnetic storage layer grain diameter; an exchange constant between grains in the nucleation host; an exchange constant between grains of the hard magnetic storage layer; a saturation polarization in the nucleation host as a function of the layer depth; a saturation polarization of the hard magnetic storage layer; a layer thickness of the nucleation host; a layer thickness of the magnetic storage layer and an exchange constant between the nucleation host and the hard magnetic layer.

In some embodiments of the magnetic recording medium, a parameter of the magnetic multilayer has a value such that a coercive magnetic field of the hard magnetic storage layer is less than ½ of the coercive magnetic field of the hard magnetic storage layer without the nucleation host.

In some embodiments of the magnetic recording medium, a parameter of the magnetic multilayer has a value such that an energy barrier of a typical grain of the hard magnetic storage layer is smaller at most by 25% of the energy barrier of a typical grain of the hard magnetic storage layer without the nucleation host.

In some embodiments of the magnetic recording medium, an energy barrier of the hard magnetic storage layer is determined by at least one of: depositing only the hard magnetic storage layer on the non-magnetic substrate; removing the nucleation host from the multilayer structure; and performing a micromagnetic calculation with parameters appropriate for the multilayer.

In some embodiments of the magnetic recording medium, a parameter of the magnetic multilayer has a value such that a coercive field of the magnetic multilayer increases when grains of the recording media are misaligned relative to a normal of the non-magnetic substrate.

In some embodiments of the magnetic recording medium, the thickness of the nucleation host has a value such that the in plane component of a magnetization of a remanent state is less than 20% of a total magnetization.

In some embodiments of the magnetic recording medium, the recording medium is usable for at least one of perpendicular recording or recording on patterned elements.

While the present invention has been particularly shown and described with reference to certain embodiments, it will be understood by those skilled in the art that various changes in form and detail may be made without departing from the spirit and scope of the invention. Accordingly, the disclosure was intended merely as illustrative and the scope of the invention is limited only as specified in the appended claims.

The invention claimed is:

1. A magnetic recording system, comprising:
    a writing head; and
    a disk, including a magnetic recording medium, comprising
        an essentially non-magnetic substrate;
        an underlayer; and
        an exchange coupled magnetic multilayer structure, including
            a hard magnetic storage layer, formed from a perpendicular anisotropy material, having a first coercive field $H_s>0.5$ T, formed such that the underlayer is between the non-magnetic substrate and the hard magnetic storage layer; and
            a nucleation host, having a second coercive field $H_n$ without the hard magnetic storage layer, lower than the first coercive field, $H_n<H_s$, wherein
        said nucleation host
            is formed on the hard magnetic storage layer such that the hard magnetic storage layer is between the nucleation host and the non-magnetic substrate,
            is exchange coupled to the hard magnetic storage layer, and
            comprises at least a first ferromagnetic layer with an anisotropy constant K1 and a second ferromagnetic layer between the first ferromagnetic layer and the hard magnetic storage layer with an increased anisotropy constant K2 greater than K1; wherein
        the first and second ferromagnetic layers are exchange coupled with an exchange coupling layer.

2. The magnetic recording system of claim 1, wherein:
    the nucleation host and the hard magnetic storage layer are in direct contact.

3. The magnetic recording system of claim 1, wherein:
    $H_c(\alpha=20°)<H_c(\alpha=45°)$, wherein $H_c(\alpha)$ is a coercive field of the magnetic recording medium if an angle between an external field and a normal of the magnetic recording medium is $\alpha$.

4. The magnetic recording system of claim 1, wherein:
    a coupling layer is disposed between the nucleation host and the hard magnetic storage layer.

5. The magnetic recording system of claim 1, wherein:
    the perpendicular anisotropy material is an FePt based alloy.

6. The magnetic recording system of claim 1, wherein:
the perpendicular anisotropy material is an $L1_0$-ordered phase material.

7. The magnetic recording system of claim 1, wherein:
the perpendicular anisotropy material is one of a CoPt based alloy, and a CoPtCr alloy.

8. The magnetic recording system of claim 1, wherein:
the perpendicular anisotropy material is one of a CoPtCrB, CoPtCrTa, and CoCr based granular media.

9. The magnetic recording system of claim 1, wherein:
the perpendicular anisotropy material is an alloy based on FePt—X, wherein X is one of Ni, Au, Cu, Pd and Ag.

10. The magnetic recording system of claim 1, wherein:
the perpendicular anisotropy material is an alloy based on CoPt—X, wherein X is one of Ni, Au, Cu, Pd and Ag.

11. The magnetic recording system of claim 1, wherein:
the perpendicular anisotropy material is a granular composite material based on FePt—C.

12. The magnetic recording system of claim 1, wherein:

a derivative k of a normalized magnetization with respect to an external magnetic field, normalized to a coercive field of the recording medium, does not change by more than a factor of 3 in a magnetization interval $-0.7 < M_z/M_s < 0.7$, wherein, M being a magnetization of the recording medium, $M_z$ being a component of M perpendicular to a plane of the recording medium, H being an external magnetic field parallel to a normal of the recording medium, dM/dH being a derivative of the magnetization of the recording medium with respect to the external magnetic field, $H_c$ being the coercive field of the recording medium, $M_s$ being a saturation magnetization of the recording medium.

* * * * *